US012790207B2

(12) United States Patent
Iihola et al.

(10) Patent No.: US 12,790,207 B2
(45) Date of Patent: Nov. 10, 2026

(54) METHOD FOR SEALING A MEMS DEVICE AND A SEALED MEMS DEVICE

(71) Applicant: Murata Manufacturing Co., Ltd., Nagaokakyo (JP)

(72) Inventors: Antti Iihola, Helsinki (FI); Jeanette Lindroos, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 479 days.

(21) Appl. No.: 18/483,980

(22) Filed: Oct. 10, 2023

(65) Prior Publication Data

US 2024/0116753 A1 Apr. 11, 2024

(30) Foreign Application Priority Data

Oct. 11, 2022 (EP) .................................... 22200958

(51) Int. Cl.
*B81C 1/00* (2006.01)
*B81B 7/00* (2006.01)

(52) U.S. Cl.
CPC .......... *B81C 1/00301* (2013.01); *B81B 7/007* (2013.01); *B81B 2207/095* (2013.01); *B81C 2203/0118* (2013.01)

(58) Field of Classification Search
CPC ......... B81C 1/00301; B81C 2203/0118; B81C 2203/0109; B81C 2203/035; B81C 1/00269; B81B 7/007; B81B 2207/095; B81B 2207/092; B81B 2207/096
See application file for complete search history.

(56) References Cited

FOREIGN PATENT DOCUMENTS

WO WO-2011111541 A1 * 9/2011 ............ H10W 76/60

* cited by examiner

*Primary Examiner* — William B Partridge
*Assistant Examiner* — Chevy J Boegel
(74) *Attorney, Agent, or Firm* — ArentFox Schiff LLP

(57) ABSTRACT

A method is provided for sealing and contacting a micro-electromechanical device that includes a silicon device wafer with MEMS device structures and a cap wafer with an electrical circuit. The device wafer includes a sealing region and an interconnection region. Moreover, the cap wafer includes a corresponding sealing region and an interconnection region. Layers of eutectic metal alloy material are deposited on the sealing and the interconnection regions of the device wafer and the cap wafer. The cap wafer is bonded to the device wafer so that the interconnection region of the device wafer is aligned with the interconnection region of the cap wafer and the sealing region of the device wafer is aligned with the sealing region of the cap wafer.

20 Claims, 10 Drawing Sheets

METHOD FOR SEALING A MEMS DEVICE AND A SEALED MEMS DEVICE

CROSS REFERENCE TO RELATED APPLICATIONS

This application claims priority to European Patent Application No. 22200958.1, filed Oct. 11, 2022, the contents of which are hereby incorporated by reference in its entirety.

TECHNICAL FIELD

The present disclosure relates to microelectromechanical (MEMS) components, and, more particularly, to MEMS components with a sealed cavity. The present disclosure further relates to MEMS components where the cavities are sealed by eutectic bonding.

BACKGROUND

Microelectromechanical devices include mobile structures etched in a silicon device wafer and electrical connections between the inside and outside of the device. These electrical connections may be connected to capacitive or piezoelectric actuators that are adjacent to the mobile structures in the device wafer. Such actuators can be used to generate forces that move the mobile structures and/or to measure their movement.

The device wafer is often bonded to a cap wafer so that the device structures can be sealed in a cavity with a controlled atmosphere. Possible bonding methods include fusion bonding, metallic bonding, glass-frit bonding, and anodic bonding, for example. One factor that influences the choice of bonding method is how the electrical connections should be drawn. It is often convenient to extend the electrical connections through the cap wafer, so that the MEMS devices in the component can be reached through electrical contacts placed on top of the cap wafer.

SUMMARY OF THE INVENTION

Accordingly, it is an object of the present disclosure is to provide a method and an apparatus for simultaneously sealing and contacting a MEMS device.

In an exemplary aspect, a method is provided for sealing and contacting a microelectromechanical device. In this aspect, the method includes forming a first conductive part in an interconnection region of a device wafer so that the first conductive part is elevated above a main surface of the device wafer; forming a layer of a first diffusion-preventing material on the device wafer and patterning the layer of the first diffusion-preventing material to be present in a sealing region of the device wafer; depositing a layer of a first eutectic metal alloy material on the device wafer and patterning the layer of the first eutectic metal alloy material to be present in the interconnection region of the device wafer on top of the first conductive part and in the sealing region of the device wafer on top of the first diffusion-preventing material; depositing a layer of a second eutectic metal alloy material on a cap wafer and patterning the layer of the second eutectic metal alloy material to be present in an interconnection region of the cap wafer and in a sealing region of the cap wafer; and bonding the cap wafer to the device wafer so that the interconnection region of the device wafer is aligned with the interconnection region of the cap wafer and the sealing region of the device wafer is aligned with the sealing region of the cap wafer.

In another exemplary aspect, a microelectromechanical device is provided that includes a silicon device wafer that defines a device plane and a vertical direction that is perpendicular to the device plane, the device wafer including MEMS device structures; and a cap wafer including an electrical circuit and being attached to the silicon device wafer by a vertical sealing structure that is substantially perpendicular to the device plane and surrounds the MEMS device structures in the device plane, so that the MEMS device structures are disposed in at least one cavity delimited at least by the device wafer, the cap wafer and the sealing structure, and a vertical electrical connector that connects the MEMS device structures to the electrical circuit. In this aspect, the sealing structure comprises at least a first diffusion-preventing part that is closer to the device wafer and a sealing eutectic metal alloy layer that is closer to the cap wafer, and the electrical connector is connected to the electrical circuit and comprises at least a first conductive part that is closer to the device wafer and an interconnecting eutectic metal alloy layer that is closer to the cap wafer.

The exemplary aspects of the present disclosure are based on the idea of preparing device wafer structures that allow the cavity to be sealed and electric connections to be made in the same metallic bonding process.

BRIEF DESCRIPTION OF THE DRAWINGS

In the following, the disclosure will be described in greater detail by means of exemplary embodiments with reference to the accompanying drawings, in which.

DETAILED DESCRIPTION

This disclosure describes an exemplary method for sealing and contacting a microelectromechanical device. Moreover, the device comprises a silicon device wafer with MEMS device structures and a cap wafer with an electrical circuit. The device wafer comprises a sealing region and an interconnection region. The cap wafer comprises a corresponding sealing region and interconnection region, and the electrical circuit extends to the interconnect region in the cap wafer.

According to an exemplary aspect, the method includes first forming a first conductive part in the interconnection region of the device wafer so that the first conductive part is elevated above the main surface of the device wafer. Next, the method includes forming a layer of a first diffusion-preventing material on the device wafer and patterning this layer so that it is present in the sealing region of the device wafer. Next, the method includes depositing a layer of a first eutectic metal alloy material on the device wafer and patterning this layer so that it is present in the interconnection region of the device wafer on top of the first conductive part and in the sealing region of the device wafer on top of the first diffusion-preventing material. Next, the method includes depositing a layer of a second eutectic metal alloy material on the cap wafer and patterning this layer so that it is present in the sealing region of the cap wafer. Finally, the method includes bonding the cap wafer to the device wafer so that the interconnection region of the device wafer is aligned with the interconnection region of the cap wafer and the sealing region of the device wafer is aligned with the sealing region of the cap wafer.

Figure 1A:
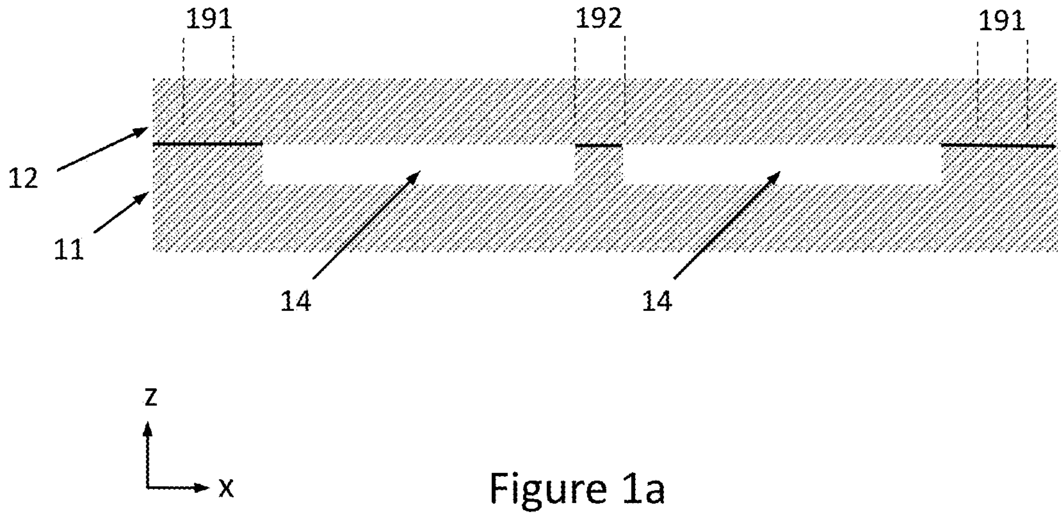
FIGS. 1*a*-1*i* illustrate steps of a manufacturing process performed on the device wafer according to an exemplary aspect.

FIG. 1*a* illustrates a silicon device wafer 12. The device wafer can for example be made of single crystal silicon or polycrystalline silicon. In this example case the device wafer 12 is attached to a handle wafer 11, and the handle wafer 11 and device wafer 12 together form a cavity-SOI wafer. In other words, the illustration shows a silicon-on-insulator wafer with one or more cavities 14 just below the surface of the device wafer 12. The device wafer could alternatively rest on some other kind of support. The cap wafer which will be described later may for example be a silicon wafer, a glass-silicon wafer, a GaAs wafer or a Ge wafer.

A sealing region 191 and an interconnection region 192 are illustrated on the surface of the device wafer 12 in FIG. 1*a*. The sealing region 191 encircles the region where the MEMS device structures are formed, which in this case coincides with the regions where the cavities 14 are located. The interconnection region 192 is where an electrical contact will be made to the cap wafer. According to the exemplary aspect, the interconnection region 192 is illustrated in the middle of the device in the x-direction, but it could be located anywhere in the xy-plane within the sealing region according to alternative aspects. Moreover, there may be multiple interconnecting regions that are separately connected to the device wafer, even though only one is illustrated in these figures. Capacitive or piezoelectric transducers, which may actuate and/or measure the movement of the MEMS device structures, may be electrically connected to the interconnecting regions. The MEMS device structures may be formed in the device wafer before the steps of the sealing and contacting method are started. Alternatively, the MEMS device structures may be formed in the device wafer in conjunction with the sealing and contacting steps. The latter alternative is illustrated in the figures of this disclosure.

Figure 1B:
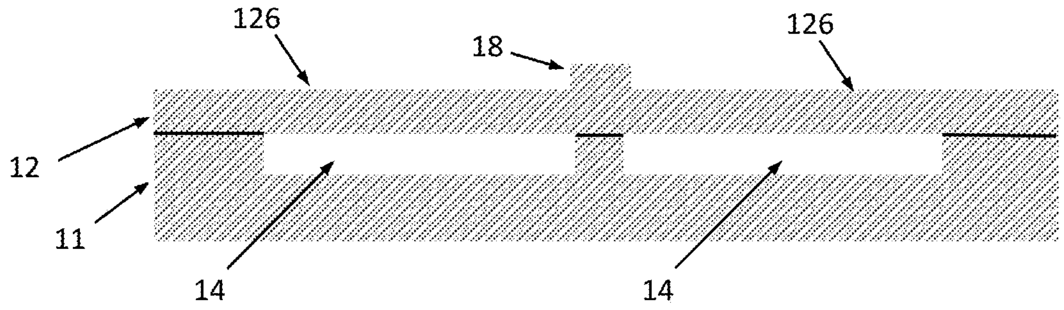

FIG. 1*b* illustrates the device wafer 12 after a first conductive part 18 has been formed in the interconnection region on the top surface of the device wafer. The first conductive part 18 is a protrusion on the device wafer, so that its top surface is elevated in relation to the main surface 126. The first conductive part 18 may for example be a part of the device wafer itself, formed through one or more LOCOS oxidation processes, which can be used for recessing selected regions on the device wafer. The main surface 126 is in this case a recessed surface in FIG. 1*b*. The silicon device wafer is sufficiently conductive to be used as a part of the electrical connection between transducers and the outside world. Alternatively, the first conductive part could be formed by depositing a conductive material, for example polysilicon, on the surface of the device wafer and patterning that layer so that it is present only in the interconnection region. In this case, the main surface 126 is not necessarily a recessed surface on the device wafer 12, although it may be a recessed surface.

The thickness of the first conductive part 18 in relation to the main surface 126 (i.e., the distance in the z-direction between the main surface and the top of the first conductive part) can, for example, be in the range 0.5-2 μm, or in the range 1-2 μm, or in the range 1.5-2 μm, or in the range 0.8-1.5 μm, or in the range 1-1.8 μm. This thickness may also be called the height of the elevation of the first conductive part 18 above the main surface 126.

Figure 1C:
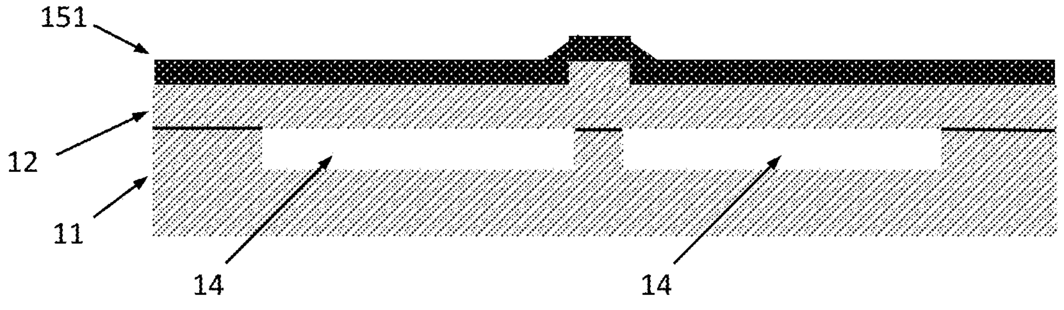

FIG. 1*c* illustrates the device after a layer 151 of a first diffusion-preventing material has been formed on the device wafer 12. The first diffusion-preventing material may for example be silicon dioxide or titanium nitride. A silicon dioxide layer may for example be formed by thermal oxidation. A layer of titanium nitride may be formed by depositing it on the device wafer.

Figure 1D:
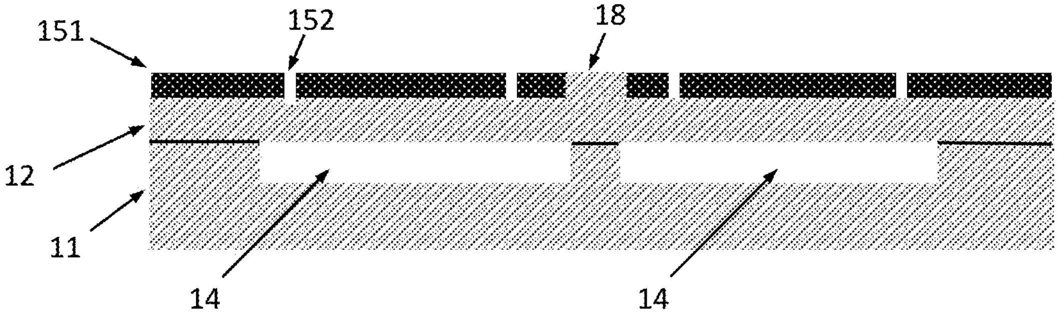

The layer 151 of a first diffusion-preventing material is elevated in relation to the main surface 126 of the device wafer 12. The thickness (in the z-direction) of the layer 151 of first diffusion-preventing material in the sealing region 191 may be equal or substantially equal to the height (in the z-direction) of the first conductive part 18 from the main surface 126 of the device wafer 12 in the interconnection region 192. The thickness of the layer 151 may be even throughout the sealing region 191. In FIG. 1*i*, the layer of the first diffusion-preventing material 151 is patterned so that it is present in the sealing region 191 on the device wafer. However, as FIGS. 1*d*-1*h* illustrate, the layer 151 may optionally be used also for other purposes before it is removed. In FIG. 1*d*, openings 152 have been made in this layer. A subsequent DRIE etch has then been performed through these openings in FIG. 1*h* to create MEMS device structures 121 and 122 in the device wafer according to an exemplary aspect.

Figure 1E:
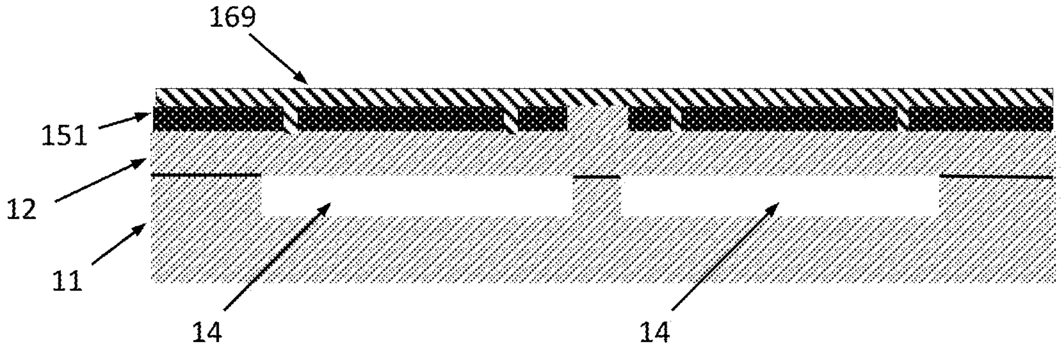

FIG. 1*e* illustrates a device, where a layer 169 of a first eutectic metal alloy material has been deposited on the surface of the device wafer, for example by sputtering. For purposes of this disclosure, the term "first eutectic metal alloy material" refers here to a layer of metal, which will later form one component in the eutectic metal alloy. Consequently, the material in layer 169 does not in itself need to be a metal alloy at this stage. If the eutectic metal alloy in the final product is AlGe, for example, this first eutectic metal alloy material may be a layer of aluminium, or an AlCu alloy with a small percentage of copper, or a layer of germanium.

Figure 1F:
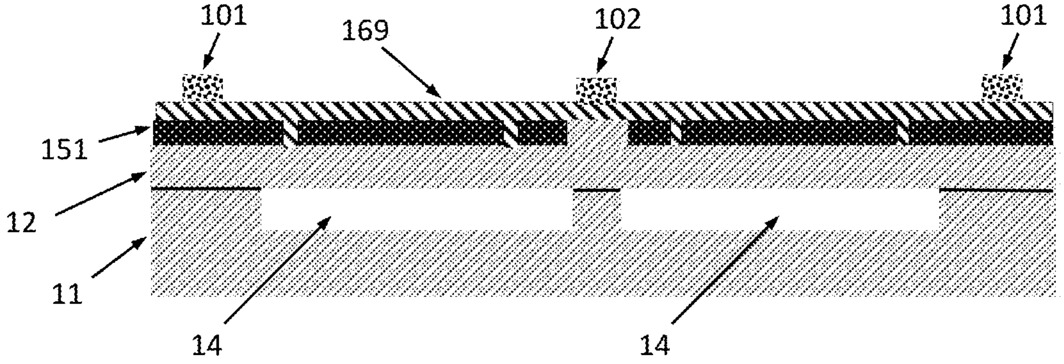
Figure 1G:
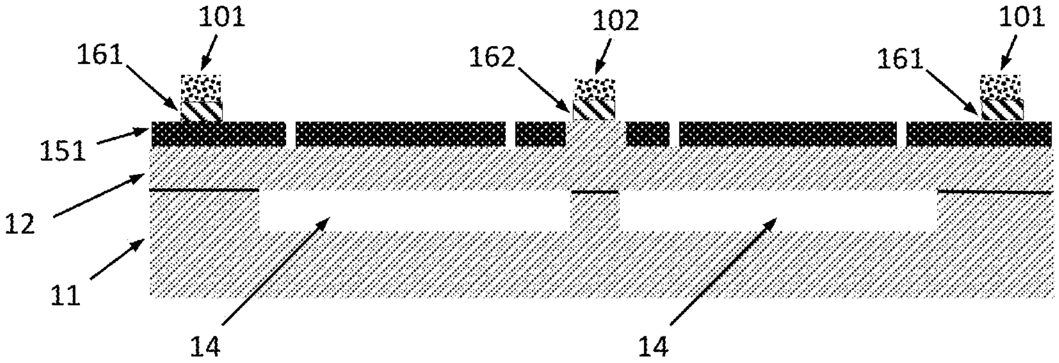
Figure 1H:
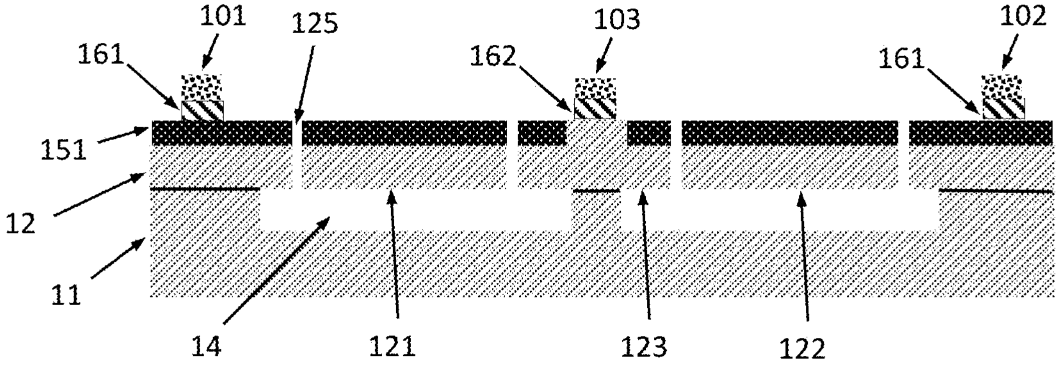
Figure 1I:
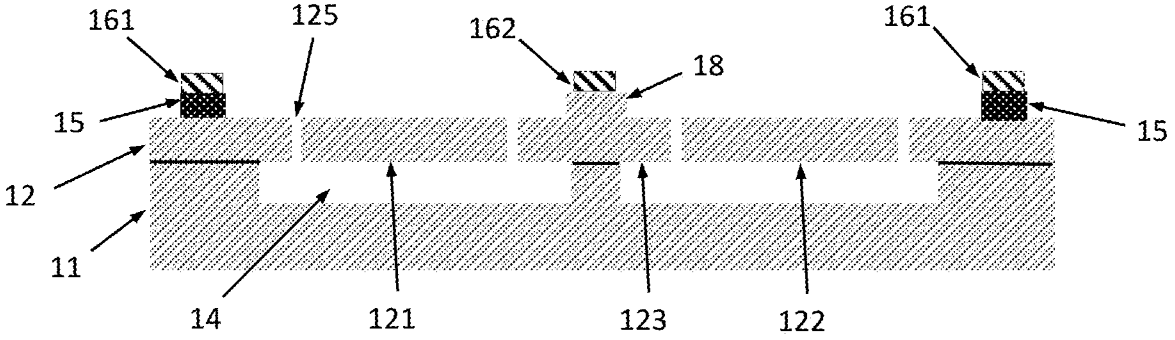

FIG. 1*f*-1*g* illustrate the patterning of layer 169. A mask layer 101-102 is deposited on top of the layer 169 of the first eutectic metal alloy material and patterned so that it protects the layer 169 in the interconnection region and in the sealing region. The rest of the layer 169 can then be removed. In FIG. 1*g*, the first eutectic metal alloy material is present in the sealing region 191 and in the interconnection region 192. The rest of the first diffusion-preventing material 151 can then also be removed from other areas on the surface of the device wafer, for example, with HF treatment, so that it only remains in the interconnection region and in the sealing region.

FIG. 1*i* illustrates the device wafer after this process has been completed. In the sealing region, a layer 161 of the first eutectic metal alloy material is stacked upon the first diffusion-preventing part 15 formed by the layer of first diffusion-preventing material as discussed above. In the interconnection region, a layer 162 of the first eutectic metal alloy material is stacked upon the first conductive part 18. The height of the layer 151 above the main surface of the device wafer may be equal to the elevation of the first conductive part 18 above that same surface, so that the top surfaces of the layers 161 and 162 will also be at the same height.

Figure 1J:
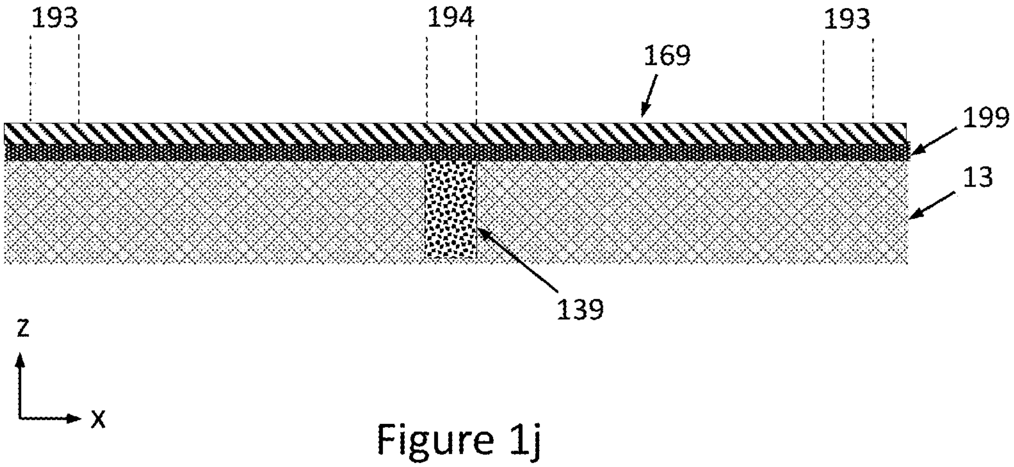
FIGS. 1*j*-1*k* illustrate steps of a manufacturing process performed on the cap wafer according to an exemplary aspect.
Figure 1K:
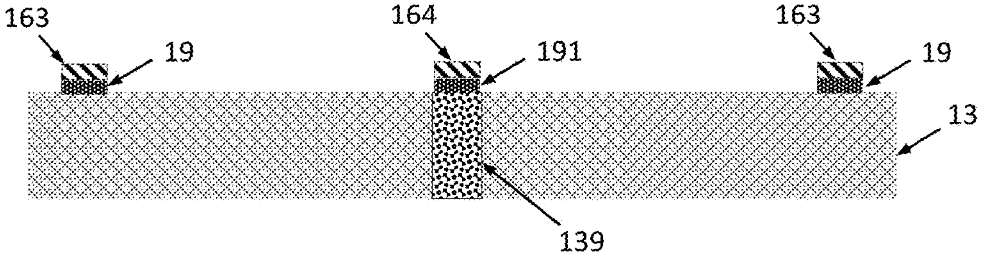

FIGS. 1*j*-1*k* illustrate the process steps, which are performed on the cap wafer. It is noted that the processing of the cap wafer is performed independently of the device wafer processing until the two are joined. The cap wafer comprises a sealing region 193 and an interconnection region 194 on its top surface, as FIG. 1*j* illustrates. When the cap wafer is placed on top of the device wafer, these regions can be aligned with the corresponding regions on the device wafer, so that the stacks formed on the two wafers in these regions are in contact with each other in the bonding process.

According to the exemplary aspect, the cap wafer comprises an electrical circuit. This circuit is illustrated simply with an electrically conductive vertical pillar 139 through the cap wafer, but it may in practice be much more complex, and it may comprise other layers on either surface of the cap wafer. The electrical circuit is connected to the interconnection region 194 on the surface of the cap wafer, so that the electrical connections formed to the interconnection region on the cap wafer also facilitate connections to the outside.

In FIG. 1*j*, an optional layer 199 of a second diffusion-preventing material has been deposited on the cap wafer 13, and a layer 169 of a second eutectic metal alloy material has then been deposited on top of the layer 199. In FIG. 1*k*, both of these layers have been patterned so that they form a second diffusion-preventing part 19, a second conductive part 191 in the interconnection region 194 and second layers 163 and 164 of the second eutectic metal alloy material in regions 193 and 194, respectively. Alternatively, the layer 169 of a second eutectic metal alloy material could be deposited on the cap wafer 13 without having the layer 199 beneath it. If the first eutectic metal alloy material is aluminium, for example, the second eutectic metal alloy material may be germanium, and vice versa.

In others words, the following two steps may be performed before the second eutectic metal alloy material is deposited on the cap wafer: a second conductive part (191 in FIG. 1*k*) may be formed in the interconnection region of the cap wafer, and a layer of a second diffusion-preventing material may be deposited on the cap wafer and patterned so that it is present at least in the sealing region of the cap wafer, forming the second diffusion-preventing part 19 between the layer 163 and the cap wafer.

The step of forming a second conductive part in the interconnection region of the cap wafer may comprise depositing a layer of conductive material on the cap wafer and patterning this layer so that it is present in the interconnection region of the cap wafer. It is noted that this conductive material and the second-diffusion-preventing material may be the same material in an exemplary aspect. Thus, in this aspect, the optional layer 199 of a second diffusion-preventing material could, for example, comprise aluminium, titanium or an aluminium/titanium alloy. The second diffusion-preventing material is configured to prevent the diffusion of the second eutectic metal alloy material 169 into the cap wafer. Furthermore, since the optional layer 199 is in this case made of a conductive material, the second conductive part 191 can be formed by patterning the same layer. This arrangement has the benefit that the vertical heights of the second conductive part 191 and the second diffusion-preventing part can easily be made equal, which then allows the elevation of the second eutectic metal alloy layers 163 and 164 over the surface of the cap wafer to be made equal.

However, the conductive material that forms the second conductive part 191 could alternatively be different from the second diffusion-preventing material, which forms the parts 19 in FIG. 1*k*. The second diffusion-preventing material could be, for example, silicon dioxide, while the conductive material could be a metal. Two separate deposition processes would in this case have to be carried out to form the second conductive part 191 and the second-diffusion-preventing part 19 before the layer 169 of a second eutectic metal alloy material is deposited on the cap wafer. It should be appreciated that this option has not been illustrated.

Figure 1L:
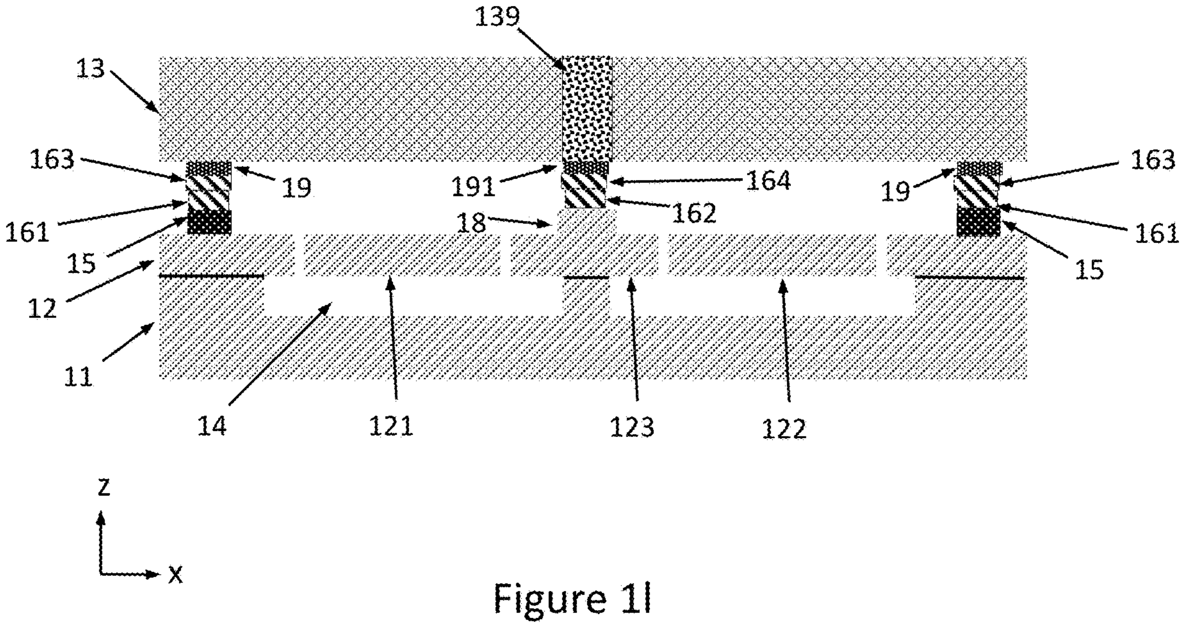
FIG. 1*l* illustrates a manufacturing step where the device wafer and the cap wafer have been aligned with each other according to an exemplary aspect.

Finally, the method comprises bonding the cap wafer to the device wafer so that the interconnection region of the device wafer is aligned with the interconnection region of the cap wafer and the sealing region of the device wafer is aligned with the sealing region of the cap wafer. This step of the exemplary method is illustrated in FIG. 1*l*, where the cap wafer has been turned around (e.g., upside down) and aligned with the device wafer so that the first (161, 162) and second (163, 164) layers of eutectic metal alloy material can be bonded to each other to form a sealing eutectic metal alloy layer in the sealing region and an interconnecting eutectic metal alloy layer in the interconnection region. Reliable structures both for sealing the microelectromechanical device and for connecting it electrically to an external circuit have thereby been formed in the same metallic bonding process.

It is noted that this metallic bonding process should be carried out at a temperature that exceeds the eutectic temperature of the eutectic metal alloy according to exemplary aspect. For example, if AlGe is used as the eutectic metal alloy, a temperature of 440-450° C. may be used. In general, the ratio between the vertical thickness of the aluminium layer and the vertical thickness of the germanium layer may beneficially be 0.59. All portions of both layers could then ideally form a part of the eutectic phase, which forms sealing the eutectic metal alloy layer 16 and the interconnecting eutectic metal alloy layer 168. Other thickness ratios will leave a residual layer of excess aluminium and/or germanium, as well as an intermediate hypoeutectic or hypereutectic phase, in the stack of layers. The ideal thickness ratio may also minimize squeeze-out effects, where excess material is pushed aside from the stack during the bonding process.

However, it should be appreciated that it is not always possible to implement the ideal thickness ratio due to manufacturing variances, for example. That is, there may be limitations in the thicknesses that can be produced with a given deposition process, and the thicknesses of other device structures may place constraints on the thicknesses of the layers of first and second eutectic metal alloy materials. Furthermore, the duration of the metallic bonding process may, due to other constraints, be shorter than the formation of a pure eutectic phase would require.

Figure 2A:
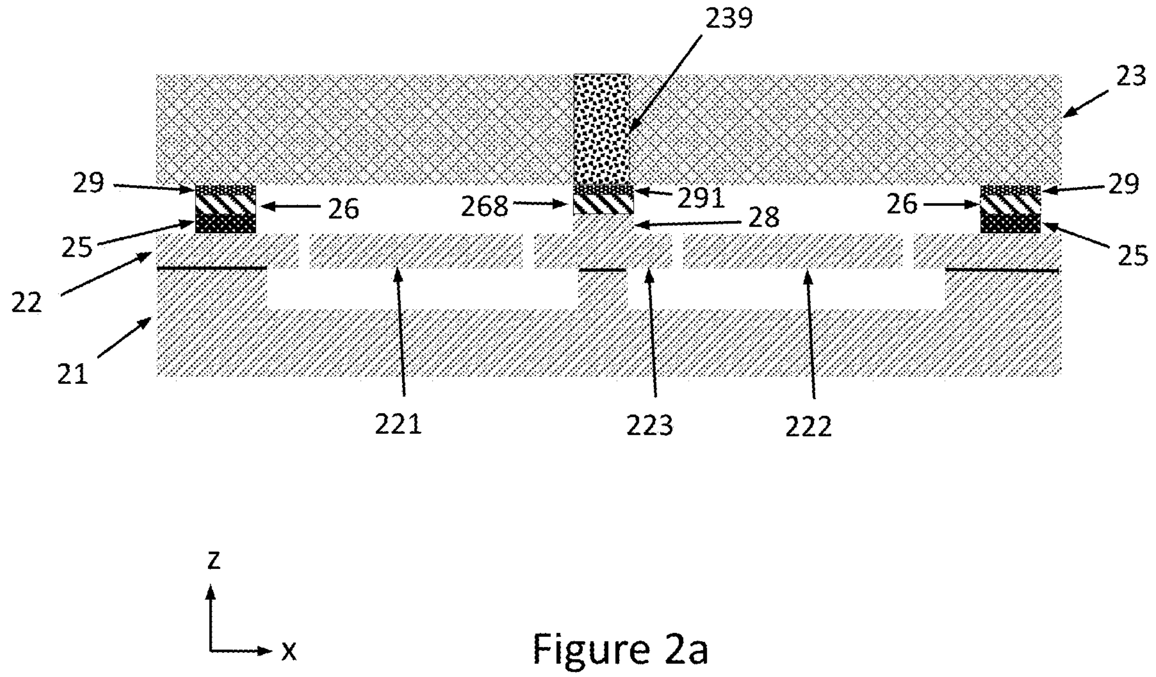
FIG. 2*a*-2*c* illustrate sealed MEMS devices according to an exemplary aspect.

FIG. 2*a* illustrates a device where reference numbers 21, 22, 23, 25, 28, 29, 239, 268, and 291 correspond to reference numbers 11, 12, 13, 15, 18, 19, 139, 168, and 191, respectively, in FIG. 1*l*. The options relating to these device parts that were presented above apply throughout this disclosure.

Figure 2B:
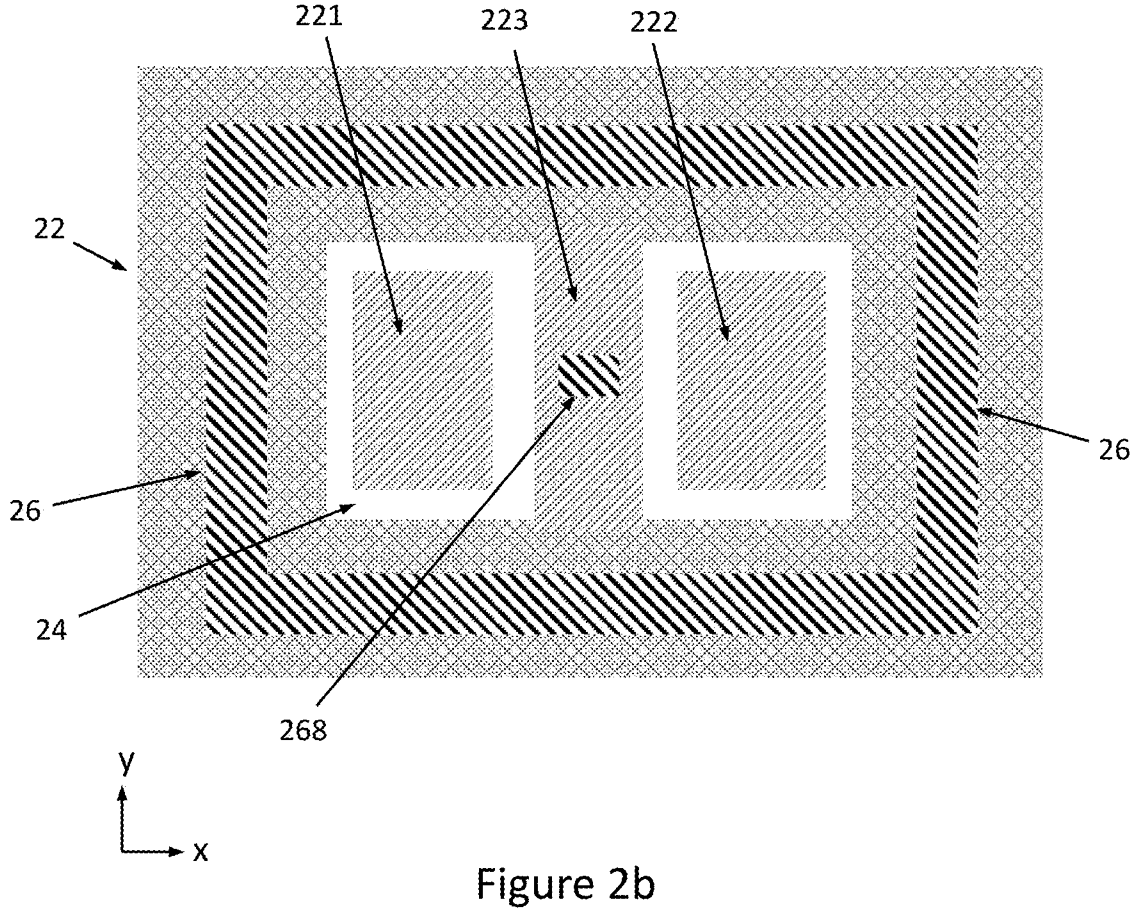

This microelectromechanical device comprises a silicon device wafer 22, that defines a device plane and a vertical direction which is perpendicular to the device plane, illustrated as the xy-plane in FIG. 2*b*. The device wafer comprises MEMS device structures 221-223 and a cap wafer 23 with an electrical circuit 239. As shown, the device wafer 22 is attached to the cap wafer 23 with a vertical sealing structure, which is substantially perpendicular to the device plane and surrounds the MEMS device structures in the device plane, so that the device structures are located in a cavity delimited at least by the device wafer, the cap wafer and the sealing structure. The device wafer is also attached to the cap wafer with a vertical electrical connector, which connects the MEMS device structures to the electrical circuit 239. The sealing structure comprises at least a first diffusion-preventing part 25, which is closer to the device wafer 22 and a sealing eutectic metal alloy layer 26, which is closer to the cap wafer 23. The electrical connector is connected to the electrical circuit, and the electrical connector comprises at least a first conductive part, which is closer to the device wafer and an interconnecting eutectic metal alloy layer 268, which is closer to the cap wafer.

The MEMS device structures 221-223 are schematically illustrated as parts of the device wafer in FIGS. 2*a* and 2*b*. Structures 221 and 222 may, for example, be mobile device structures configured to move in relation to the rest of the device wafer. Structure 223 is a fixed part of the device wafer, as it is attached to underlying handle wafer 21. It may nevertheless be considered a MEMS device structure because it forms a part of the electrical connection. Force transducers, which are not illustrated in FIGS. 2*a*-2*b*, are also MEMS device structures, and they can be connected to the electrical connector illustrated in the middle of the device according to an exemplary aspect.

The eutectic metal alloy layers in the sealing regions of the device wafer and the cap wafer have in FIG. 2*a* been bonded to each other, so that they together form a sealing eutectic metal alloy layer 26, which seals the perimeter of the MEMS device. Correspondingly, the eutectic metal alloy layers in the interconnection regions of the device wafer and the cap wafer have been bonded to each other, so that they together form an interconnecting eutectic metal alloy layer 268, which electrically connects the active parts of the MEMS device, for example the transducers mentioned previously, to the electrical circuit 239 in the cap wafer.

As explained above, the second diffusion-preventing parts 29 are optional components according to an exemplary aspect. Regardless of whether these parts are included, the simultaneous bonding of the sealing region and the interconnection region ensures that both the sealant and the electrical connection are reliable. FIG. 2*b* illustrates the microelectromechanical device schematically in the xy-plane. The sealing eutectic metal alloy layer 26 surrounds device structures 221-223 in the device plane. The interconnecting eutectic metal alloy layer 268, which corresponds to the position of the vertical electrical connector in the xy-plane, could be placed on any fixed part of the device wafer 22. It does not necessarily have to be in the middle. Furthermore, there could be multiple vertical electric connectors with the same structure, as the one shown in FIG. 2*a*.

Figure 2C:
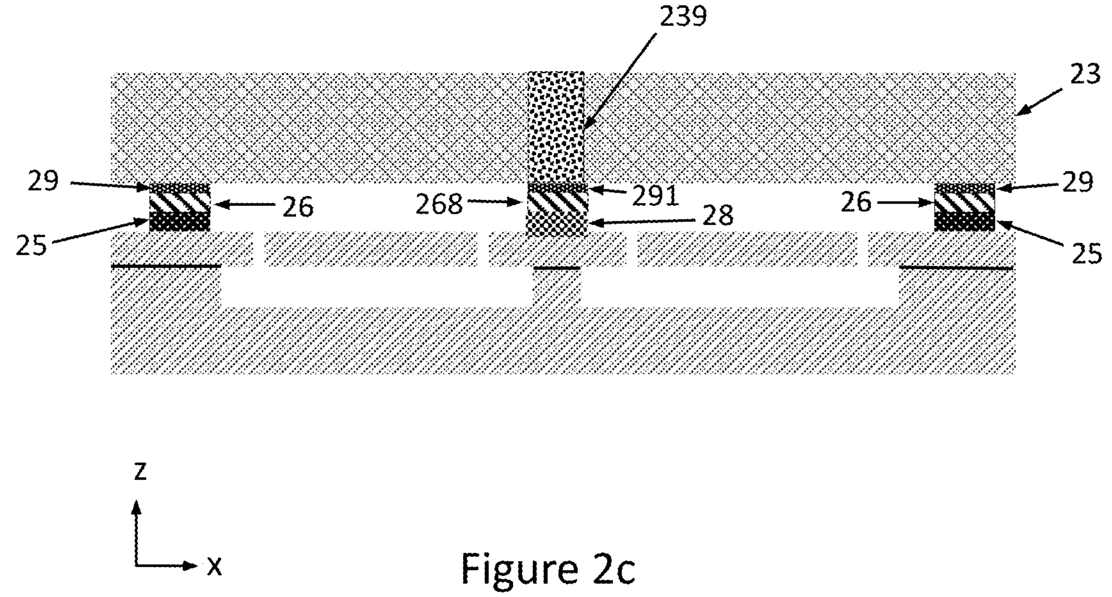

As mentioned previously, the first conductive part 28 may be a part of the device wafer 22, as in FIG. 2*a*, where it is a protrusion in the device wafer. FIG. 2*c* illustrates an alternative configuration, where the first conductive part 28 is not a part of the device wafer. The layer 28 has instead been deposited on the surface of the device wafer 22. In an exemplary aspect, this layer can, for example, be a layer of polysilicon or any other sufficiently conductive material.

The vertical gap between the device wafer and the cap wafer may, for example, be in the range of 1.5-2.5 μm in the finished device. It is typically preferable to minimize any tilting of the cap wafer with respect to the device wafer during and after the metallic bonding process. This may be achieved as described above. The vertical height of the first diffusion-preventing part 25 may be substantially equal to the vertical height of the first conductive part 28. It can then be easily ensured that the layer of the first eutectic metal alloy material on the device wafer has the same thickness, and it extends to the same height in both the sealing region and the interconnection region. Similarly, the vertical height of the optional second diffusion-preventing part 29 may be substantially equal to the vertical height of the optional second conductive part 291. It can then be easily ensured that the layer of second eutectic metal alloy material on the cap wafer has the same thickness and extends to the same height above the surface of the cap wafer in both the sealing region and in the interconnection region. This will be the case, even if no second diffusion-preventing part 29 and second conductive part 291 is used, as the surface of the cap wafer is flat. Equally thick layers of the first and the second eutectic metal alloy materials in the sealing and interconnection region ensure that the sealing eutectic metal alloy layer and the interconnecting eutectic metal alloy layer will have substantially the same composition and thickness in the finished MEMS device.

However, the risk of tilting can in some cases be minimized further by building additional standoffs between the device wafer and the cap wafer. By fixing the distance between the device wafer and the cap wafer, such standoffs may also limit the compression of the eutectic metallic alloy layers during the bonding process. They thereby facilitate uniform thickness and uniform formation of the eutectic phase in the sealing eutectic metal alloy layer and the interconnecting eutectic metal alloy layer.

In a device with standoffs, the device wafer comprises a standoff region, and the cap wafer also comprises a corresponding standoff region. The method described above then comprises the following steps before the cap wafer is bonded to the device wafer: depositing a layer of first standoff material on the device wafer and patterning this layer so that it is present in the standoff region of the device wafer, and depositing a layer of second standoff material on the cap wafer and patterning this layer so that it is present in the standoff region of the cap wafer.

In a corresponding device, the device wafer is also attached to the cap wafer with one or more vertical standoffs, and each standoff comprises a first standoff layer and a second standoff layer, wherein the first standoff layer is closer to the device wafer and the second standoff layer is closer to the cap wafer.

Figure 3A:
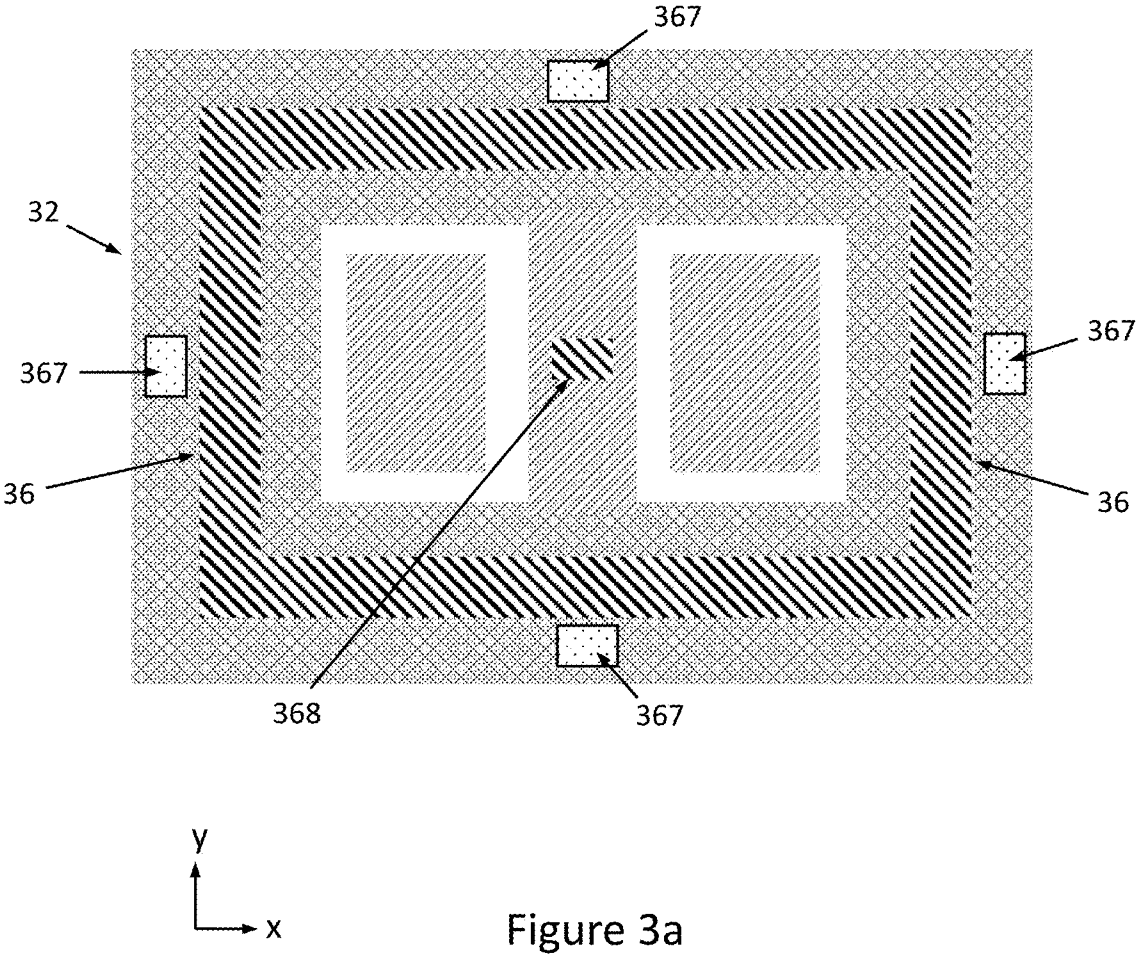
FIGS. 3*a*-3*b* illustrate standoffs in a sealed MEMS device according to an exemplary aspect.

It is noted that the standoff regions could be located anywhere in the device plane. FIG. 3*a* illustrates a device, where the reference numbers 32, 36, and 368 correspond to the reference numbers 22, 26 and 268, respectively, in FIG. 2*b*. Standoff regions 367 are here located outside of the sealing region, so that the sealing region 36 lies between the standoff region 36 and the interconnection region 368. The standoff regions 367 may be placed symmetrically around the sealing region 36, as FIG. 3*a* illustrates. However, the sealing regions could alternatively be placed inside the sealing region, which may be desirable particularly if vertical standoffs should be included in the finished product. Vertical standoffs which lie outside of the sealing region may, if necessary, be removed after the metallic bonding process has been completed.

Figure 3B:
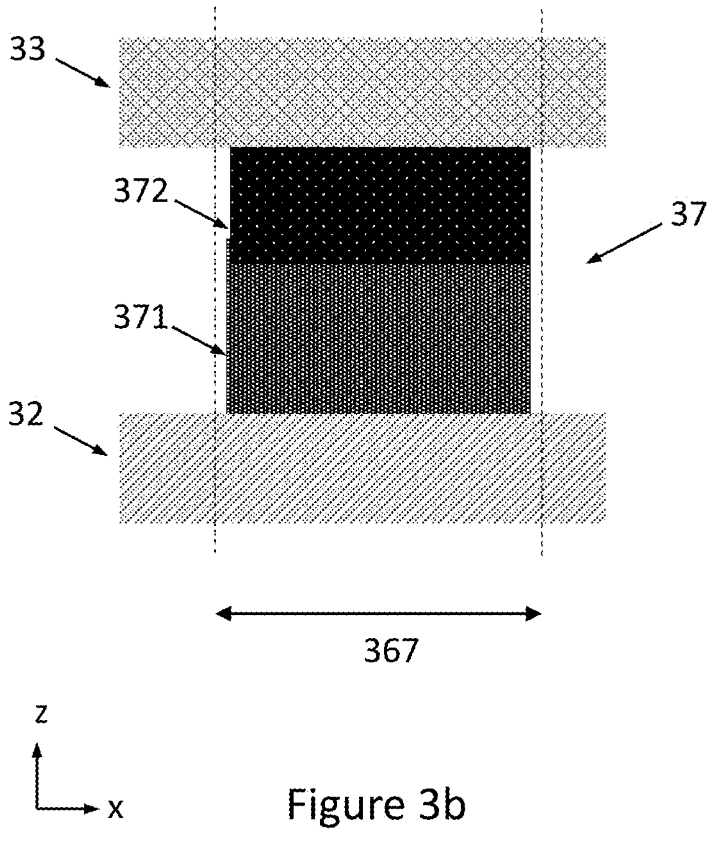

FIG. 3*b* illustrates a standoff 37 between a device wafer 32 and a cap wafer 33. Prior to the metallic bonding process, a layer 371 of a first standoff material has been deposited on the device wafer and a layer 372 of a second standoff material has been deposited on the cap wafer. These two layers are then brought into contact with each other in the metallic bonding process, so that a vertical standoff 37 is formed.

According to an exemplary aspect, the first standoff material and the first diffusion-preventing material may be the same material. The material may for example be silicon dioxide. Alternatively, it may be a metal such as aluminium. The layer 371 may therefore be formed in the same process where layer 15 in FIG. 1*i* is formed. The layer 372 of second standoff material may also be a layer of silicon dioxide. Additional layers, which may for example comprise the second diffusion-preventing material mentioned above, may also be included in the standoff. In general, the composition and thickness of the standoff should not be affected by the metallic bonding process. The standoffs can thereby set the height of the sealing and interconnecting eutectic metal alloy layers, which comprise multiple phases during the eutectic bonding process and can therefore be more difficult to control.

In general, it is noted that in any embodiment presented in this disclosure, the interconnecting eutectic metal alloy layer and the sealing eutectic metal alloy layer can be made of the same alloy. This material may be AlGe, as discussed earlier, or it may be AuSb, AuSi or CuSb. The first and second eutectic metal alloy materials can be chosen accordingly.

In general, it is noted that the exemplary embodiments described above are intended to facilitate the understanding of the present invention and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. A method for sealing and contacting a microelectromechanical device, the method comprising:

forming a first conductive part in an interconnection region of a device wafer so that the first conductive part is elevated above a main surface of the device wafer;

forming a layer of a first diffusion-preventing material on the device wafer and patterning the layer of the first diffusion-preventing material to be present in a sealing region of the device wafer;

depositing a layer of a first eutectic metal alloy material on the device wafer and patterning the layer of the first eutectic metal alloy material to be present in the interconnection region of the device wafer on top of the first conductive part and in the sealing region of the device wafer on top of the first diffusion-preventing material;

depositing a layer of a second eutectic metal alloy material on a cap wafer and patterning the layer of the second eutectic metal alloy material to be present in an interconnection region of the cap wafer and in a sealing region of the cap wafer; and bonding the cap wafer to the device wafer so that the interconnection region of the device wafer is aligned with the interconnection region of the cap wafer and the sealing region of the device wafer is aligned with the sealing region of the cap wafer.

2. The method according to claim 1, wherein, before the depositing of the layer of the second eutectic metal alloy material, the method further comprises:

forming a second conductive part in the interconnection region of the cap wafer; and depositing a layer of a second diffusion-preventing material on the cap wafer and patterning the layer of the second diffusion-preventing material to be present at least in the sealing region of the cap wafer.

3. The method according to claim 2, wherein the forming of the second conductive part in the interconnection region of the cap wafer comprises depositing a layer of conductive material on the cap wafer and patterning the layer of the conductive material to be present in the interconnection region of the cap wafer.

4. The method according to claim 3, wherein the conductive material and the second-diffusion-preventing material are a same material.

5. The method according to claim 1, wherein the first conductive part is a part of the device wafer.

6. The method according to claim 1, wherein each of the device wafer and the cap wafer comprise corresponding standoff regions.

7. The method according to claim 6, wherein, before bonding the cap wafer to the device wafer, the method further comprises:

depositing a layer of first standoff material on the device wafer and patterning the layer of the first standoff material to be present in the standoff region of the device wafer; and depositing a layer of second standoff material on the cap wafer and patterning the layer of the second standoff material to be present in the standoff region of the cap wafer.

8. The method according to claim 7, wherein the first standoff material and the first diffusion-preventing material are a same material.

9. A microelectromechanical device comprising:

a silicon device wafer that defines a device plane and a vertical direction that is perpendicular to the device plane, the device wafer including MEMS device structures; and a cap wafer including an electrical circuit and being attached to the silicon device wafer by:

a vertical sealing structure that is substantially perpendicular to the device plane and surrounds the MEMS device structures in the device plane, so that the MEMS device structures are disposed in at least one cavity delimited at least by the device wafer, the cap wafer and the sealing structure, and a vertical electrical connector that connects the MEMS device structures to the electrical circuit, wherein the sealing structure comprises at least a first diffusion-preventing part and a sealing eutectic metal alloy layer, with the at least a first diffusion- preventing part being closer to the device wafer than the sealing eutectic metal alloy layer, and the sealing eutectic metal alloy layer being closer to the cap wafer than the first diffusion-preventing part, and wherein the electrical connector is connected to the electrical circuit and comprises at least a first conductive part and an interconnecting eutectic metal alloy layer, with the first conductive part being closer to the device wafer than the interconnecting eutectic metal alloy layer, and the interconnecting eutectic metal alloy layer being closer to the cap wafer than the first conductive part.

10. The microelectromechanical device according to claim 9, wherein the sealing structure further comprises a second diffusion-preventing part that lies between the sealing eutectic metallic alloy layer and the cap wafer.

11. The microelectromechanical device according to claim 10, wherein the electrical connector further comprises a second conductive part that lies between the first conductive part and the interconnecting eutectic metal alloy layer.

12. The microelectromechanical device according to claim 11, wherein the second diffusion-preventing part and the second conductive part are a same material.

13. The microelectromechanical device according to claim 9, wherein the first conductive part is a part of the device wafer.

14. The microelectromechanical device according to claim 9, wherein the device wafer is attached to the cap wafer with one or more vertical standoffs.

15. The microelectromechanical device according to claim 14, wherein each of the one or more vertical standoffs comprises a first standoff layer and a second standoff layer, with the first standoff layer being closer to the device wafer than the second standoff layer, and the second standoff layer being closer to the cap wafer than the first standoff layer.

16. The microelectromechanical device according to claim 14, wherein the first standoff layer and the first diffusion-preventing layer are a same material.

17. A microelectromechanical device comprising:

a silicon device wafer having a planar surface and including MEMS device structures; and a cap wafer including an electrical circuit and being attached to the silicon device wafer by:

a vertical sealing structure that is substantially perpendicular to the planar surface of the silicon device wafer and that surrounds the MEMS device structures so that the MEMS device structures are disposed in at least one cavity delimited at least by the device wafer, the cap wafer and the sealing structure, and a vertical electrical connector that connects the MEMS device structures to the electrical circuit, wherein the sealing structure comprises at least a first diffusion-preventing part and a sealing eutectic metal alloy layer, with the first diffusion-preventing part being closer to the device wafer than the sealing eutectic metal alloy layer, and the sealing eutectic metal alloy layer being closer to the cap wafer than the first diffusion- preventing part, and wherein the electrical connector is connected to the electrical circuit and comprises at least a first conductive part and an interconnecting eutectic metal alloy layer, with the first conductive part being closer to the device wafer than the interconnecting eutectic metal alloy layer, and the interconnecting eutectic metal alloy layer being closer to the cap wafer than the first conductive part.

18. The microelectromechanical device according to claim 17, wherein the sealing structure further comprises a second diffusion-preventing part that lies between the sealing eutectic metallic alloy layer and the cap wafer, wherein the electrical connector further comprises a second conductive part that lies between the first conductive part and the interconnecting eutectic metal alloy layer, and wherein the second diffusion-preventing part and the second conductive part are a same material.

19. The microelectromechanical device according to claim 17, wherein the first conductive part is a part of the device wafer.

20. The microelectromechanical device according to claim 17, wherein the device wafer is attached to the cap wafer with one or more vertical standoffs, wherein each of the one or more vertical standoffs comprises a first standoff layer and a second standoff layer, with the first standoff layer being closer to the device wafer than the second standoff layer, and the second standoff layer being closer to the cap wafer than the first standoff layer.

* * * * *